US009615475B2

(12) United States Patent
Bae et al.

(10) Patent No.: US 9,615,475 B2
(45) Date of Patent: Apr. 4, 2017

(54) TOUCH PANEL SEALING APPARATUS

(71) Applicant: Samsung Electronics Co., Ltd., Gyeonggi-do (KR)

(72) Inventors: Yu-Dong Bae, Gyeonggi-do (KR); Kun-Woo Baek, Gyeonggi-do (KR); Jin-Hyoung Park, Gangwon-do (KR); Eun-Hwa Lee, Gyeonggi-do (KR); Jeong-Seok Lee, Gyeonggi-do (KR); Dae-Kwang Jung, Gyeonggi-do (KR); Ji-Hoon Jung, Seoul (KR)

(73) Assignee: Samsung Electronics Co., Ltd (KR)

( * ) Notice: Subject to any disclaimer, the term of this patent is extended or adjusted under 35 U.S.C. 154(b) by 357 days.

(21) Appl. No.: 14/041,467

(22) Filed: Sep. 30, 2013

(65) Prior Publication Data
US 2014/0091536 A1 Apr. 3, 2014

(30) Foreign Application Priority Data
Sep. 28, 2012 (KR) .......................... 10-2012-0109202

(51) Int. Cl.
H05K 5/00 (2006.01)
H05K 7/00 (2006.01)
H05K 5/06 (2006.01)
G06F 3/01 (2006.01)
G06F 3/0354 (2013.01)

(52) U.S. Cl.
CPC ............... H05K 5/06 (2013.01); G06F 3/016 (2013.01); G06F 3/03547 (2013.01)

(58) Field of Classification Search
USPC .............................. 361/679.02, 752, 679.01
See application file for complete search history.

(56) References Cited

U.S. PATENT DOCUMENTS

| 7,999,660 | B2 | 8/2011 | Cybart et al. |
| 2008/0048997 | A1 | 2/2008 | Gillespie et al. |
| 2011/0285652 | A1* | 11/2011 | Imamura ............... G06F 1/1616 345/173 |

FOREIGN PATENT DOCUMENTS

| KR | 1019990064226 | 7/1999 |
| KR | 1020090048770 | 5/2009 |
| KR | 101070079 | 9/2011 |
| KR | 1020110104265 | 9/2011 |

* cited by examiner

*Primary Examiner* — Andargie M Aychillhum
(74) *Attorney, Agent, or Firm* — The Farrell Law Firm, P.C.

(57) ABSTRACT

A sealing apparatus of a touch panel provided in a portable terminal including a body and the touch panel, wherein the sealing apparatus is attached and coupled to a coupling area between the body and the touch panel to seal the coupling area while the touch panel is suspended over the body by a resilient member.

15 Claims, 17 Drawing Sheets

TOUCH PANEL SEALING APPARATUS

PRIORITY

This application claims priority under 35 U.S.C. §119(a) to Korean Application Serial No. 10-2012-0109202, which was filed in the Korean Intellectual Property Office on Sep. 28, 2012, the entire content of which is incorporated herein by reference.

BACKGROUND OF THE INVENTION

1. Field of the Invention

The present invention relates generally to a touch panel sealing apparatus.

2. Description of the Related Art

In general, touch panels are provided on portable terminals such as, for example, navigation devices, PDA terminals, MP3 players, Portable Multimedia Players (PMPs), electronic books, or tablet PCs. Such touch panels generally include resistive touch panels, capacitive touch panels, ultrasonic touch panels, and infrared touch panels according to operational principles thereof, with resistive touch panels and capacitive touch panels being more widely used. In particular, capacitive touch panels have been widely used due to their advantages in durability and transmission. Conventional technologies related to the capacitive touch panel are disclosed in Korean Unexamined Patent Publication No. 10-1999-00640226 and Korean Unexamined Patent Publication No. 10-2009-0048770

In recent years, in addition to a concept of a user touching a touch panel and inputting data, haptic feedback devices, including the concept of reflecting an intuitive experience of a user through an interface and diversifying feedback, are being widely employed.

The term "haptic" refers to a sense of touch which can be felt by the finger tip of a user or a stylus pen when the user touches an object and is provided with feedback when the skin touches a surface of the object. For example, the haptic feedback device provides a haptic feedback such that, when touching a button displayed on a screen, the user feels like he or she actually touches or presses the button. The technology of a haptic feedback device is disclosed, for example, in Korean Unexamined Patent Publication No. 10-2011-0075714. Structures, in which a touch panel is suspended by a resilient member such as a spring in a body of a portable terminal, are disclosed in Korean Patent No. 10-1070079 and U.S. Pat. No. 7,999,660.

In order to provide vibrations to a touch panel, the touch panel needs to be suspended above the body of a portable terminal. However, since a space exists between the body and the suspended touch panel, foreign substances such as dust or water may easily enter into the body.

In addition, when a sealant such as foam, poron, or a double-sided tape is used to prevent entry of foreign substances into a space between the touch panel and the body, the touch panel is attached to the body even if foreign substances can be successfully blocked out. Thus, vibrating forces created to vibrate the touch panel when a haptic driving unit is driven are weakened and are also transferred to the body while significantly reducing vibrating forces provided to the touch panel.

SUMMARY OF THE INVENTION

The present invention has been made to address at least the problems and disadvantages described above, and to provide at least the advantages described below. Accordingly, aspects of the present invention provide a sealing apparatus for a touch panel which prevents foreign substances from entering between a touch panel and a body of a portable terminal while the touch panel is suspended above the body, by attaching and coupling the touch panel to the body, and prevents vibrations of a haptic driving unit from being transferred to the body when the touch panel vibrates through driving of the haptic driving unit.

According to one aspect of the present invention, there is provided a sealing apparatus of a touch panel. The sealing apparatus is provided in a portable terminal which includes a body and the touch panel, wherein the sealing apparatus is attached and coupled to a coupling area between the body and the touch panel to seal the coupling area while the touch panel is suspended over the body by a resilient member.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Figure 1:
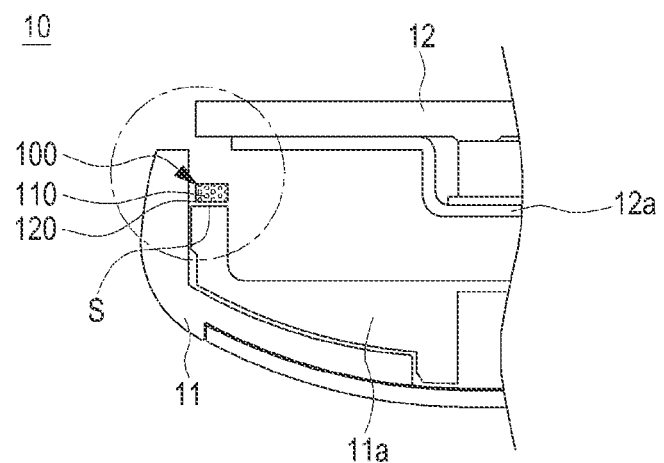
FIG. 1 is a view showing a sealing apparatus of a touch panel according to an embodiment of the present invention.

Hereinafter, various embodiments of the present invention will be described with reference to the accompanying drawings. In the description, thicknesses of lines shown in the drawings and sizes of constituent elements may be exaggerated for clarity and convenience. Further, the following terms are defined considering their functions in the present invention and may be varied according to intentions and customs of a user or manager. Thus, the terms should be defined based on the contents of the entire specification. Further, although ordinal numbers such as first and second are used in the description of the embodiments of the present invention, their sequence may be arbitrarily determined and the description of the preceding elements may be applied in the description of the succeeding elements. It should be noted that the configurations of the embodiments of the present invention may be interchangeable.

The portable terminal 10 (FIGS. 1, 7, 12 and 15) according to the embodiments of the present invention include a body 11 and a touch panel 12. An internal mounting module (not shown) with multi-functionality is provided inside the body 11, and a touch panel 12 for displaying a screen while performing various functions through contact is provided on a front surface of the body 11. In particular, a haptic driving unit (not shown) for providing a haptic feedback, so that a user feels like he or she actually presses a button when the user contacts the touch panel 12, is provided in the touch panel 12. The haptic driving unit may be disposed, for example, on a lower surface of the touch panel 12. A resilient member (not shown), which is configured to resiliently support the touch panel 12 while suspending the touch panel 12 from the body 11 so that the touch panel 12 can vibrate in the body 11 during driving of the haptic driving unit, is provided in a space between the body 11 and the touch panel 12. According to the embodiments of the present invention, the resilient member is integrally provided in a bezel 12a disposed between the touch panel 12 and the body 11 and more specifically, in a display bracket 11a. A coupling area S, where the touch panel 12 is not attached to the body 11, is formed by the resilient member around the touch panel 12.

A sealing apparatus 100, 200, 300, or 400 is provided in the coupling area S. The sealing apparatuses 100, 200, 300, and 400 of the embodiments of the present invention have at least two functions. First, foreign substances such as dust or water, which may enter into the coupling area S, can be blocked by attaching and sealing the touch panel 12 and the body 11. Second, if the haptic driving unit is driven, the touch panel 12 vibrates while suspended above the body 11 by the resilient member, in which case contact between the body 11 and the touch panel 12 is minimized so that the vibrations are prevented from being transferred to the body 11 through the sealing apparatus 100, 200, 300, or 400 connected to the touch panel 12 (i.e., so that the vibrating forces can be primarily provided to the touch panel 12 without affecting the body 11).

Hereinafter, the embodiments of the sealing apparatuses 100, 200, 300, and 400 of the touch panel 12 will be described with reference to the accompanying drawings.

FIGS. 1 to 6 show a sealing apparatus 100 according to an embodiment of the present invention. FIGS. 7 to 11 show a sealing apparatus 200 according to another embodiment of the present invention. Embodiments of the present invention illustrate the scenario in which the sealing apparatus is coupled between the body 11 and the touch panel 12. However, one of ordinary skill in the art will understand that the sealing apparatus of the present invention may be disposed anywhere in the portable terminal 10 that prevents the vibrations of the touch panel 12 from being transferred to the body 11.

Referring to FIG. 1, the sealing apparatus 100 includes a resilient attaching part 110, and a hollow part 120. In particular, the resilient attaching part 110 mainly serves to seal the apparatus 100 and the hollow part 120 mainly serves to prevent the vibrations of the touch panel 12 from being transferred to the body 11. More specifically, the resilient attaching part 110 is positioned between the body 11 and the touch panel 12 in the coupling area S to seal the coupling area S. Accordingly, foreign substances from outside of the portable terminal 10, such as dust, can be prevented from entering the body 11. If an empty space is formed by the hollow part 120 inside the resilient attaching part 110, the resilient attaching part 110 is deformed when the resilient attaching part 110 is pressed in the coupling area S of the resilient attaching part 110. Although the resilient attaching part 110 couples the touch panel 12 and the body 11, the hollow part 120, which is formed in the resilient attaching part 100, serves to prevent vibrations of the touch panel 12 produced by the haptic driving unit from being transferred to the body 11.

In an embodiment of the present invention, the sealing apparatus 100 may include, for example, poron. That is, the resilient attaching part 110 and a plurality of pores 120 which are formed inside the resilient attaching part 110 are made of a poron material. Accordingly, the poron is inserted between the body 11 and the touch panel 12 to perform a sealing function. The plurality of pores 120 are formed in the poron to restrict vibrations of the touch panel 12 from being transferred to the body 11. When external foreign substances such as dust attempts to enter, the dust particles enter into and are stacked in the pores 120 formed on the outside, thereby further improving the sealing functionality.

Further provided is a coupling member 20 (See FIGS. 3-4B) for fixing the sealing apparatus 100, including poron, when the sealing apparatus 100 is positioned in the coupling area S. The coupling member 20 may be provided between the touch panel 12 and the resilient attaching part 110 (FIG. 4A) or between the resilient attaching part 110 and the body 11 (FIG. 4B to fix the sealing apparatus 100 to the body 11, the touch panel 12, or both the body 11 and the touch panel 12 (FIG. 3).

Hereinafter, a coupling shape of the sealing apparatus 100 including a poron material according to an embodiment of the present invention will be described in detail. Various configurations for inserting the sealing apparatus 100 into the coupling area S between the touch panel 12 and the body 11 may be provided. For example, a coupling member 20 or a coupling structure including a boss 32 and a recess 31 coupled to the boss 32 is provided. FIGS. 1-6D illustrate various structures for fixing poron to the body 11 and the touch panel 12. For example, poron may be directly attached between the body 11 and the touch panel 12 (FIGS. 1-2); the coupling members 20 may be provided between the poron and the touch panel 12 (FIG. 4A), between the poron and the body 11 (FIG. 4B), or between the poron and both the body 11 and the touch panel 12 (FIG. 3). A coupling member may be provided in at least one of the poron, the body 11, and the touch panel 12 and forming a coupling structure including a boss 32 and a corresponding recess 31 (FIGS. 5A-6D).

Figure 2:
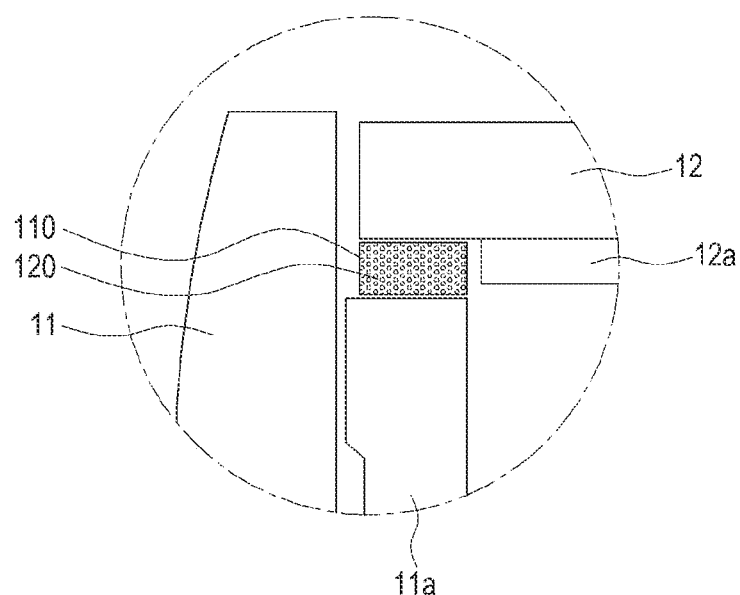
FIG. 2 is an enlarged view showing a coupled state of the sealing apparatus of FIG. 1 according to an embodiment of the present invention.

FIG. 2 is a view showing a coupled state of the sealing apparatus of FIG. 1. Before coupling, poron having a thickness that is thicker than the coupling area S is provided between the touch panel 12 and the body 11 as the coupling area S between the touch panel 12 and the body 11 is pressed.

Figure 3:
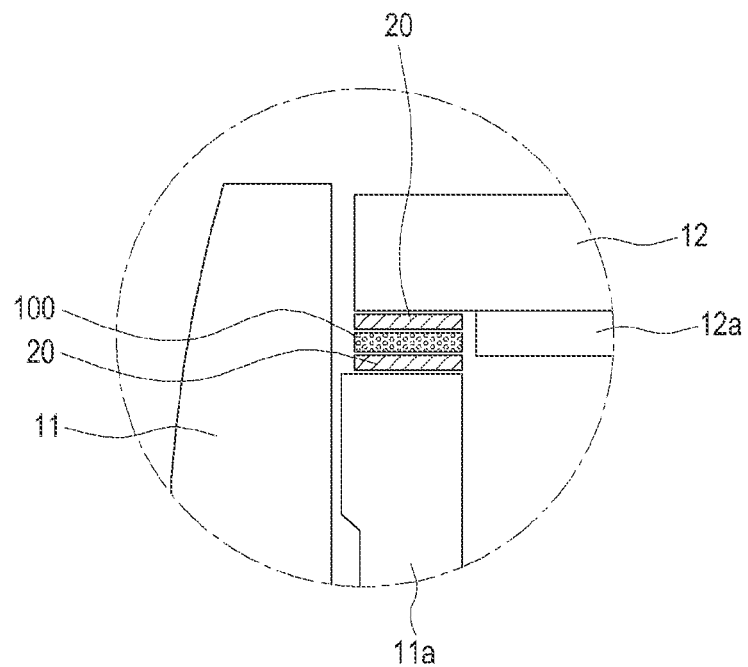
FIG. 3 is a view showing coupling members provided on upper and lower surfaces of the sealing apparatus of FIG. 1 according to an embodiment of the present invention.

FIG. 3 shows an embodiment in which coupling members 20 are provided on upper and lower surfaces of the sealing apparatus of FIG. 1. Referring to FIG. 3, the coupling members 20 are provided both between the poron and the body 11 and between the poron and the touch panel 12. That is, the coupling members 20 are provided on the upper and lower surfaces of the poron, respectively such that the upper surface of the poron is fixed to the touch panel 12 by the coupling member 20 provided on the upper surface of the poron and the lower surface of the poron is fixed to the body 11 by the coupling member 20 provided on the lower surface of the poron.

Figure 4A:
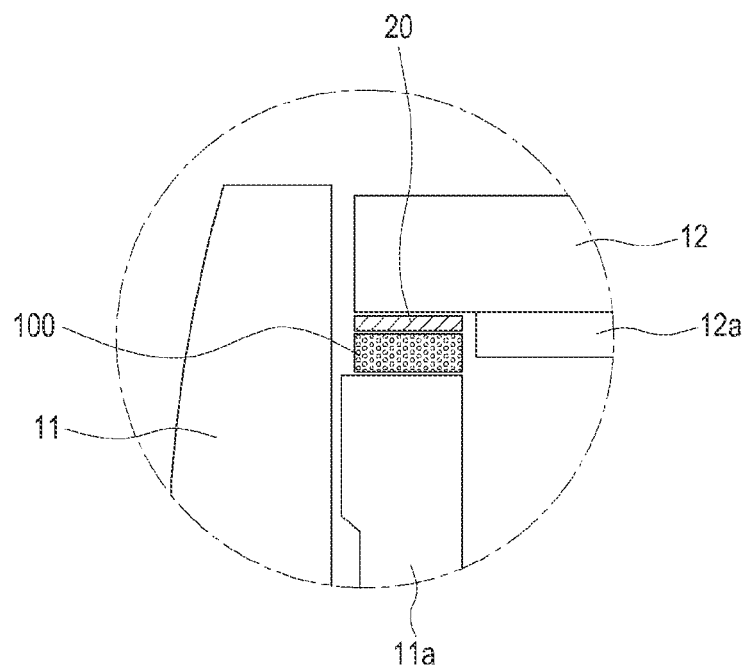
FIGS. 4A and 4B are views showing another form in which a coupling member is provided between a touch panel and the sealing apparatus of FIG. 1 according to an embodiment of the present invention.
Figure 4B:
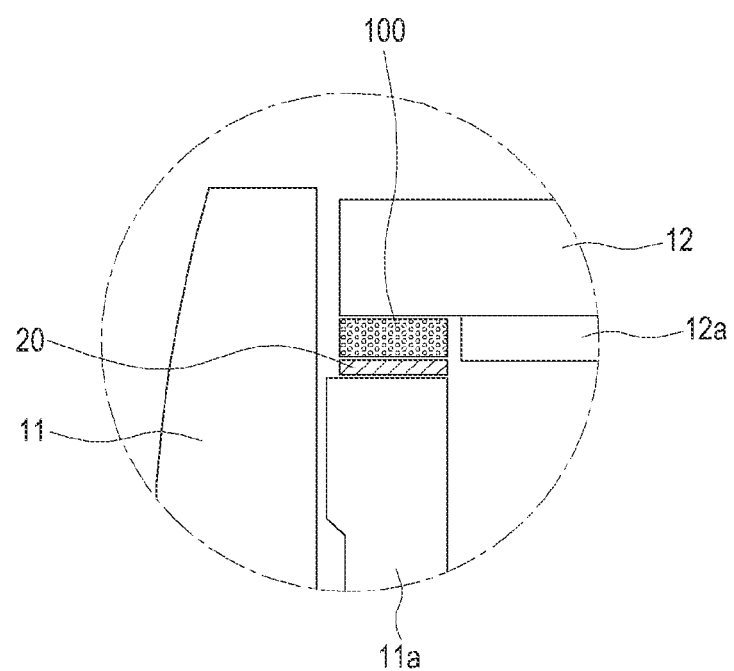
Figure 5A:
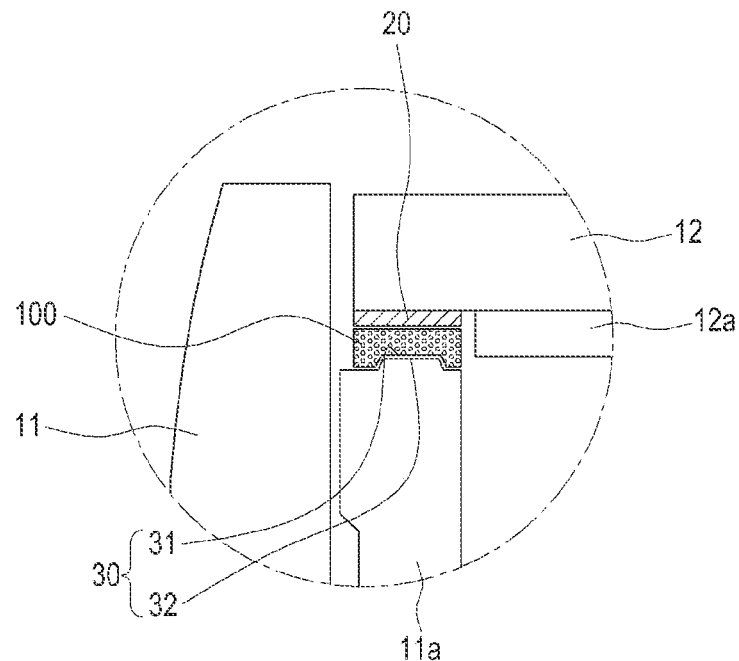
FIGS. 5A to 5D are views showing the sealing apparatus of FIG. 1 having a coupling member and a coupling structure according to an embodiment of the present invention.
Figure 5B:
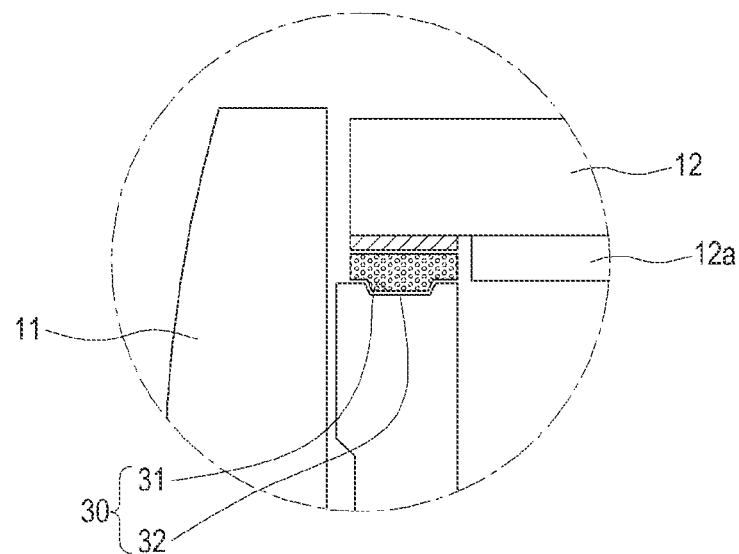
Figure 5C:
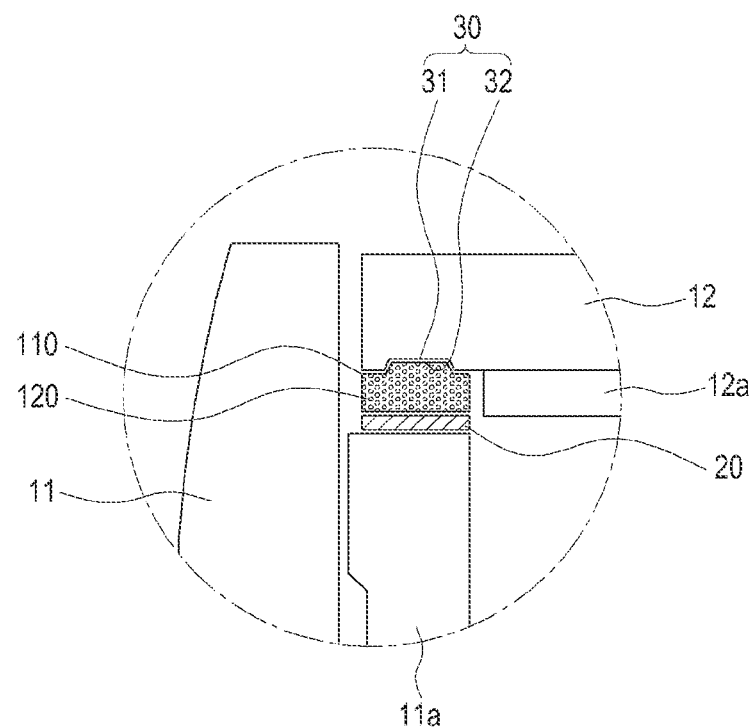
Figure 5D:
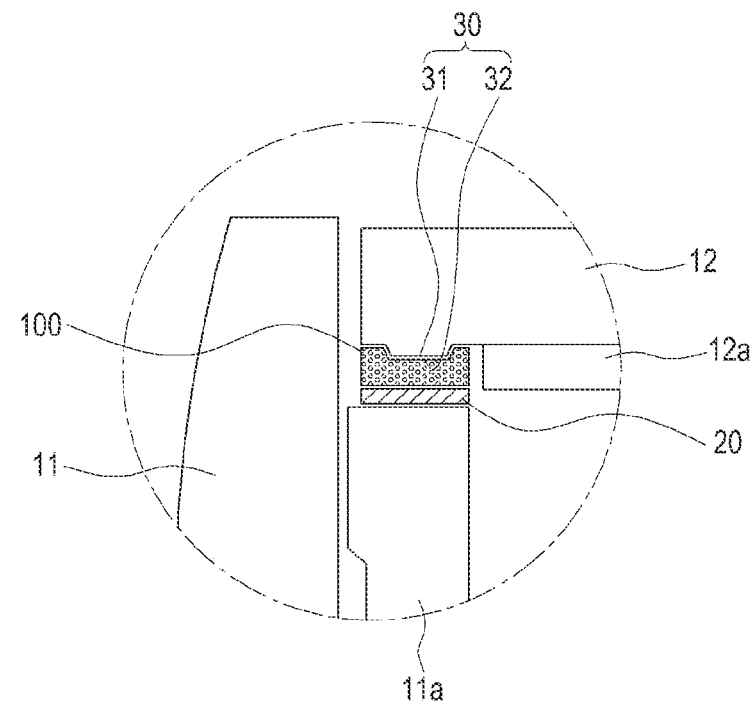
Figure 6A:
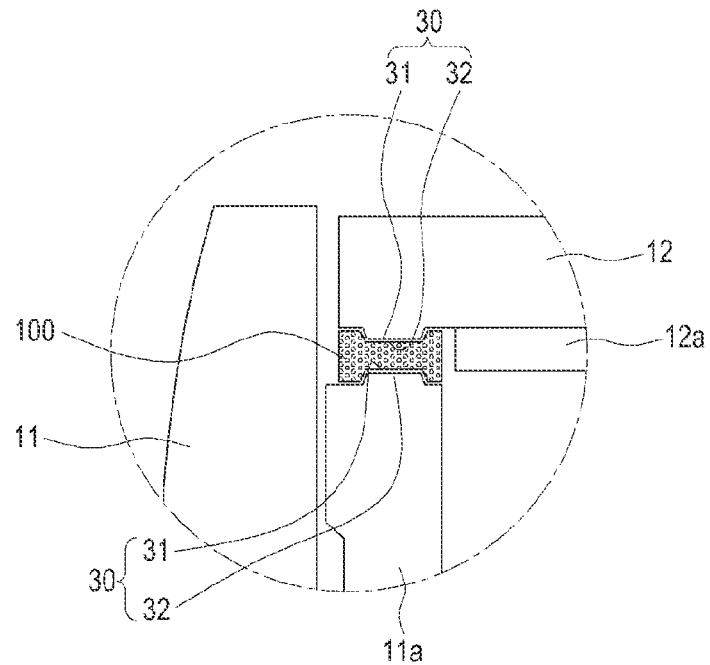
FIGS. 6A to 6D are views showing another form of the sealing apparatus of FIG. 1 having a coupling member and a coupling structure according to an embodiment of the present invention.
Figure 6B:
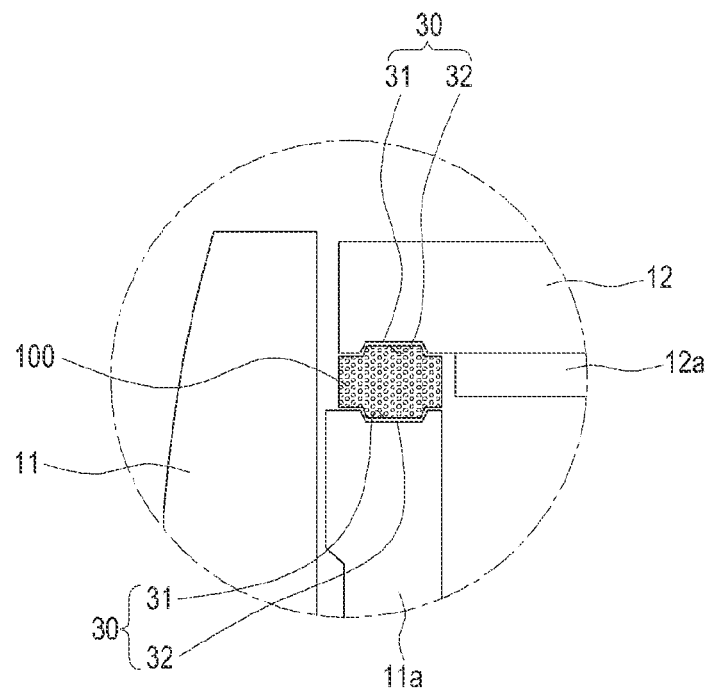
Figure 6C:
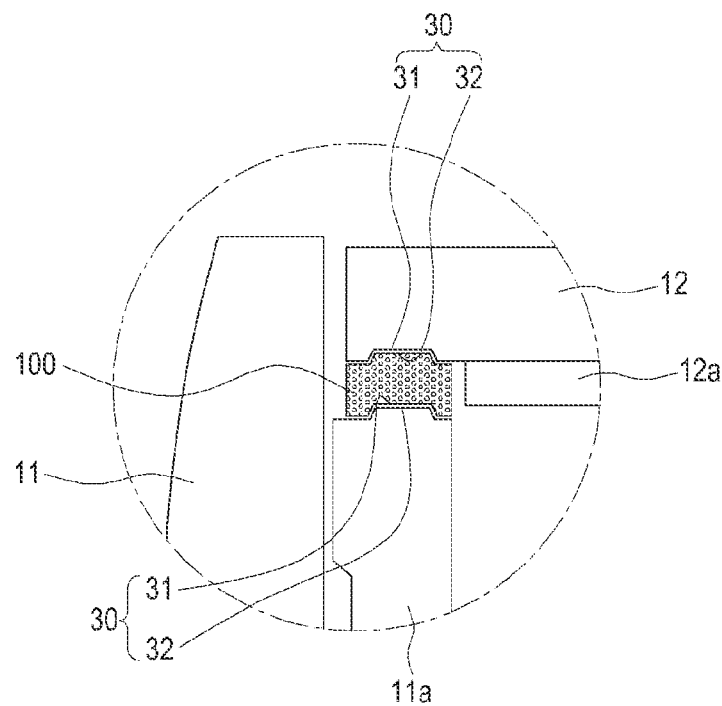
Figure 6D:
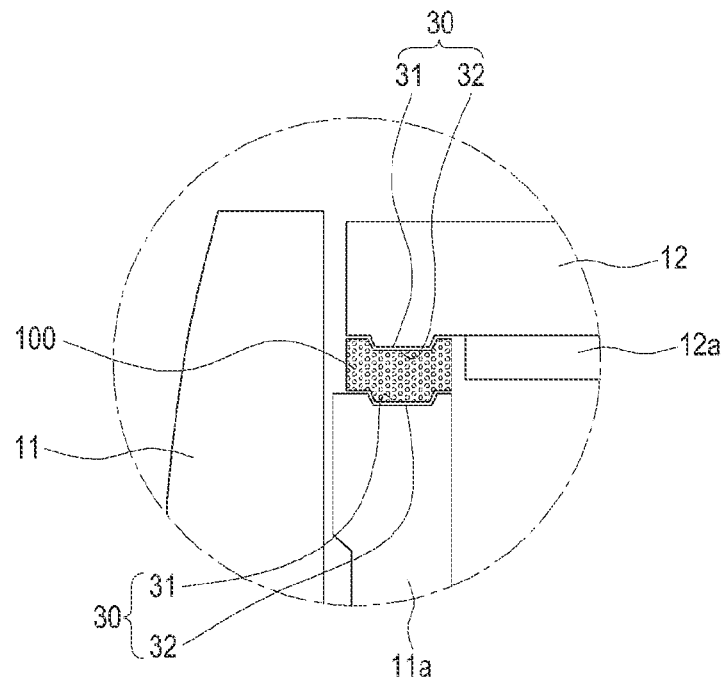

FIGS. 4A and 4B are views showing a coupling member provided between the touch panel 12 or the body 11 and the sealing apparatus of FIG. 1. Referring to FIGS. 4A and 4B, the coupling member 20 is provided between the poron and the body 11 or between the poron and the touch panel 12 and the other side is simply directly attached and fixed to the touch panel 12 or the body 11. That is, the poron fixes any one of the body 11 and the touch panel 12 by using the coupling member 20, and the other side is simply attached and fixed to the touch panel 12 or the body 11. For example, when the body 11 and the poron are coupled to each other by the coupling member 20, the touch panel 12 and the poron are pressed in the coupling area S to be sealed while facing each other. Alternatively, when the touch panel 12 and the poron are coupled to each other by the coupling member 20, the body 11 and the poron are pressed in the coupling area S to be sealed while facing each other.

FIGS. 5A to 5D are views showing the sealing apparatus having a coupling member and a coupling structure. Referring to FIGS. 5A to 5D, the coupling member 20 is provided only between the poron and the body 11 or between the poron and the touch panel 12 while the other side includes a coupling structure such as, for example, a boss 32 and a recess 31. That is, when the poron is coupled to the body 11 by one coupling member 20 in an embodiment of the present invention, a boss 32 or a recess 31 is formed on an opposite surface of the poron coupled to the touch panel 12 and a recess 31 or a boss 32 is formed on the touch panel 12 such that the boss 32 is coupled to the recess 31. Alternatively, when the poron is coupled to the touch panel 12 by the coupling member 20, a boss 32 or a recess 31 is formed on an opposite surface of the poron coupled to the touch panel 12 and a recess 31 or a boss 32 is formed on the body 11 such that the boss 32 is coupled to the recess 31.

FIGS. 6A to 6D are views showing another form of the sealing apparatus of FIG. 1 having a coupling structure. Referring to FIGS. 6A to 6D, in an embodiment of the present invention, coupling structures 50, each including a boss 32 and a recess 31, are provided between the poron and the body 11 and between the poron and the touch panel 12, respectively. For example, if recesses 31 are formed on upper and lower surfaces of the poron, bosses 32 are formed in the body 11 and the touch panel 12 to be coupled to the recesses 31. Alternatively, if bosses 32 are formed on upper and lower surfaces of the poron, recesses 31 are formed in the body 11 and the touch panel 12 to be coupled to the bosses 32 of the poron. When a boss 32 is formed on an upper surface of the poron and a recess 31 is formed on a lower surface of the poron, a recess 31 is formed in the touch panel 12 to be coupled to the boss 32 protruding from an upper surface of the poron and a boss 32 is formed in the body 11 to be coupled to the recess 31 recessed on the lower surface of the poron. Alternatively, when a recess 31 is formed on the upper surface of the poron and a boss 32 is formed on the lower surface of the poron, a boss 32 is formed in the touch panel 12 to be coupled to the recess 31 recessed on the upper surface of the poron and a recess 31 is formed in the body 11 to be coupled to the boss 32 protruding from the lower surface of the poron.

It should be noted that in the embodiments of the present invention, the shapes and forms of the bosses 32 and the recesses 31 are not limited to those illustrated in the drawings. That is, the embodiments of the present invention may be variously modified. For example, a plurality of bosses 32 and a plurality of recesses 31 may be formed adjacent to each other to be coupled to each other to further reinforce a sealing force and the bosses 32 and the recesses 31 may have circular shapes instead of quadrilateral shapes to be coupled and fixed by the resiliency of the poron.

The coupling member 20, described above, may have a bonding material such as, for example, double-sided tape, may be coupled through coupling of a fixing screw, or may be integrally fixed to a panel or a bracket through injection-molding.

Thus, the coupling area S may be attached or coupled by the coupling member 20 or the coupling structure 30 to be sealed so that external foreign substances cannot enter, and vibrations generated by the haptic driving unit can be prevented from being transferred to the body 11 by means of the pores 120 provided in the poron.

Figure 7:
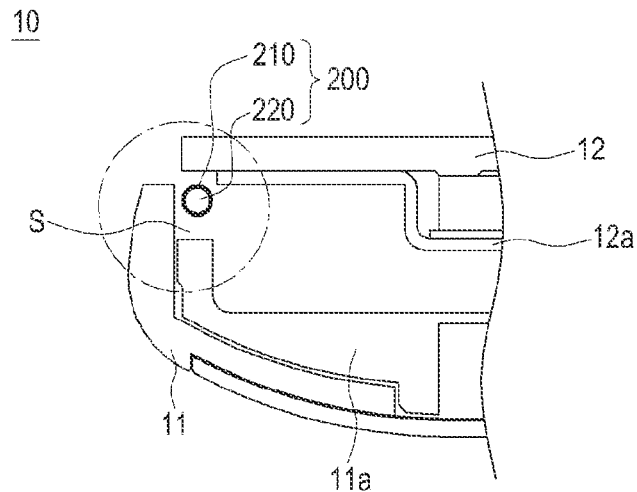
FIG. 7 is a view showing a sealing apparatus of a touch panel according to an embodiment of the present invention.

Hereinafter, the sealing apparatus according to another embodiment of the present invention will be described in detail with reference to FIGS. 7 to 11. FIG. 7 is a view showing the sealing apparatus of a touch panel 12 according to an embodiment of the present invention. Referring to FIG. 7, the sealing apparatus 200 includes a microtube 210. That is, the resilient attaching part includes a microtube 210 including a hollow portion 220 inside of the microtube. Specifically, the microtube 210 having the hollow portion 220 therein has a tube shape having a predetermined thickness.

Accordingly, as the microtube is inserted between the body 11 and the touch panel 12 to be pressed in the coupling area S, the circular microtube 210 is resiliently deformed into an elliptical shape by a resilient force of the microtube 210 and the hollow portion 220. Accordingly, as the microtube 210 is pressed, portions of the microtube 210 which contact the touch panel 12 and the body 11 are widened, and by a resilient force of the microtube 210, the sealing apparatus 200 seals the coupling area S of the body 11 and the touch panel 12, which is necessary suspend the touch panel 12 over the body 11.

If the haptic driving unit (not shown) provided under the touch panel 12 is driven to vibrate the touch panel 12 while the coupling area S of the body 11 and the touch panel 12 is sealed by the microtube 210, the vibrations of the touch panel 12 are prevented from being transferred to the body 11 by the resilient force of the microtube 210 and the hollow portion 220. Further, entrance of foreign substances can be prevented by tightly attaching the body 11 and the touch panel 12 to an outer surface of the microtube 210.

Further, in an embodiment of the present invention, as with the sealing apparatus 100 of the embodiments illustrated in FIGS. 1-6D, a coupling member 20 and/or a coupling structure 30 for fixing the sealing apparatus 200 while the sealing apparatus 200 is positioned in the coupling area S may be provided. That is, like the coupling member 20 of the embodiments illustrated in FIGS. 3-5D, the coupling member 20 may be provided (1) between the touch panel 12 and the microtube 210 (FIG. 9B), (2) between the microtube 210 and the body 11 to fix the sealing apparatus 200 to the body 11 (FIG. 9C), or (3) between the microtube 210 and both the body 11 and the touch panel 12.

Hereinafter, a coupling form of the sealing apparatus 200 including the microtube 210 according to an embodiment of the present invention will be described in more detail.

Figure 8:
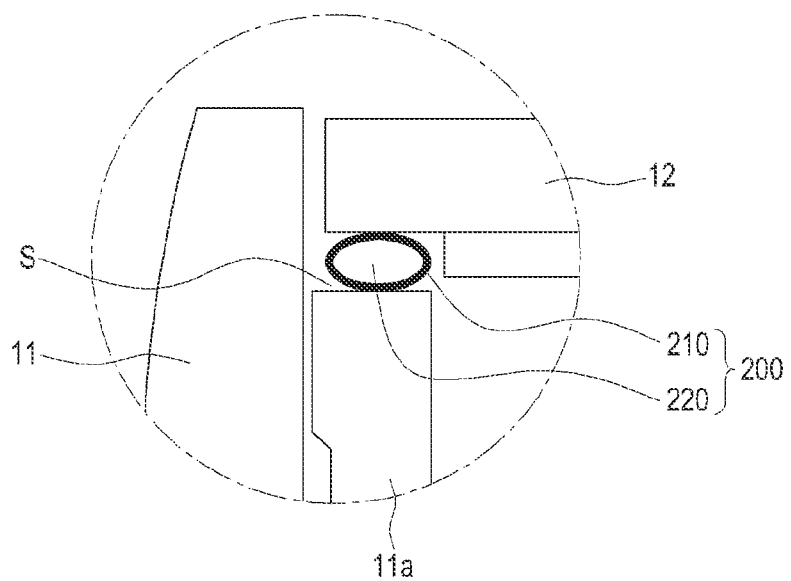
FIG. 8 is an enlarged view showing a state in which the sealing apparatus of FIG. 7 is coupled according to an embodiment of the present invention.
Figure 9A:
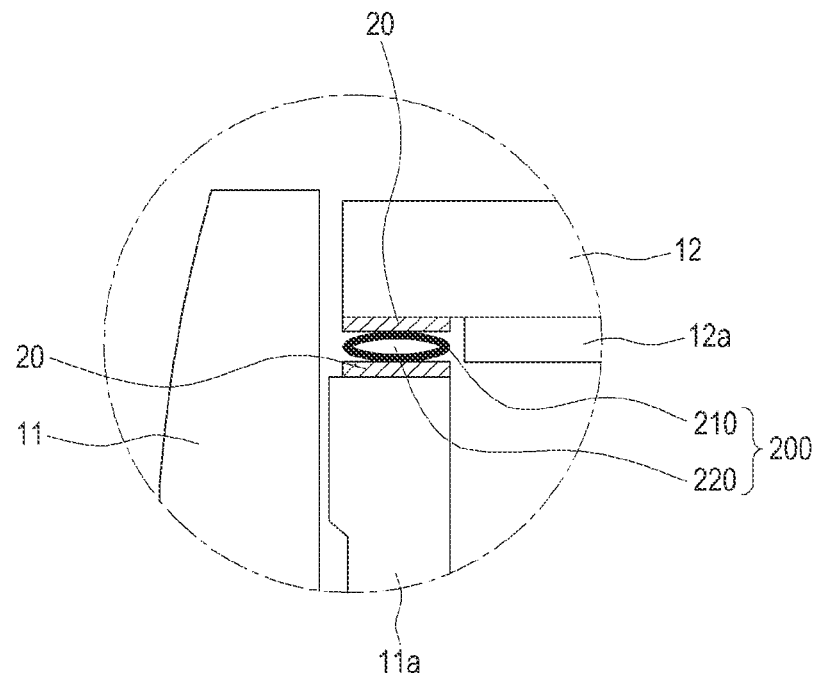
FIGS. 9A to 9C are views showing a form in which a coupling member is provided in the sealing apparatus of FIG. 7 according to an embodiment of the present invention.

FIG. 8 is a view showing a coupled state of the sealing apparatus 200 of FIG. 7. Referring to FIG. 8, only the microtube 210 without the coupling member 20 or the coupling structure 30 is provided in the coupling area S to be sealed by directly attaching the microtube 210 to the body 11 and the touch panel 12. In another embodiment, the coupling member 20 is provided both between the microtube 210 and the body 11 and between the microtube 210 and the touch panel 12 to be fixed (FIG. 9A). That is, if the touch panel 12 is coupled to the body 11 so that the touch panel 12 is suspended while the circular microtube 210 is provided inside the coupling area S, the circular microtube 210 is pressed between the body 11 and the touch panel 12 into an elliptical shape so that the body 11 and the touch panel 12 are attached and coupled to each other forming a seal.

Figure 9B:
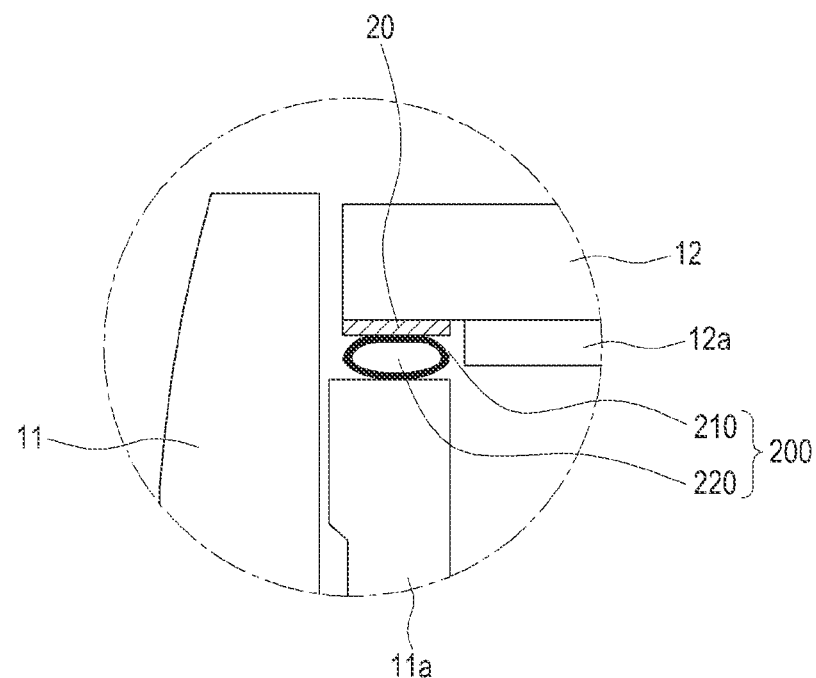
Figure 9C:
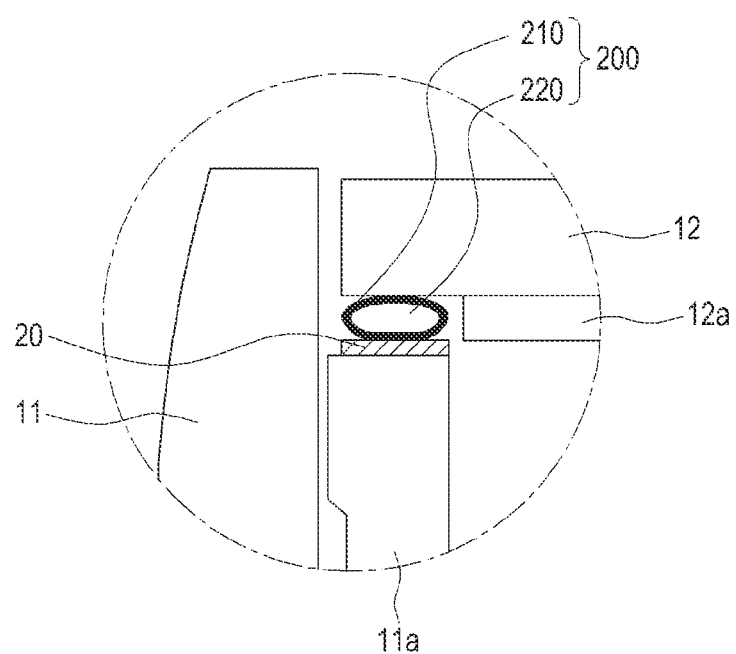

FIGS. 9A to 9C are views showing a form in which a coupling member 20 is provided to the sealing apparatus of FIG. 7. As shown in FIG. 9A, in order to fix the microtube more firmly, the coupling members are provided on the touch panel 12 and the body 11 and the microtube is pressed in the coupling area S to be attached and fixed to both of the coupling members 20 so as to perform a sealing function. Further, as shown in FIGS. 9B and 9C, the coupling member 20 may be coupled to the body 11 or the touch panel 12 and the other side of the microtube 210 may be coupled by direct attachment to the either the touch panel 12 or the body 11 to form a seal.

Figure 10A:
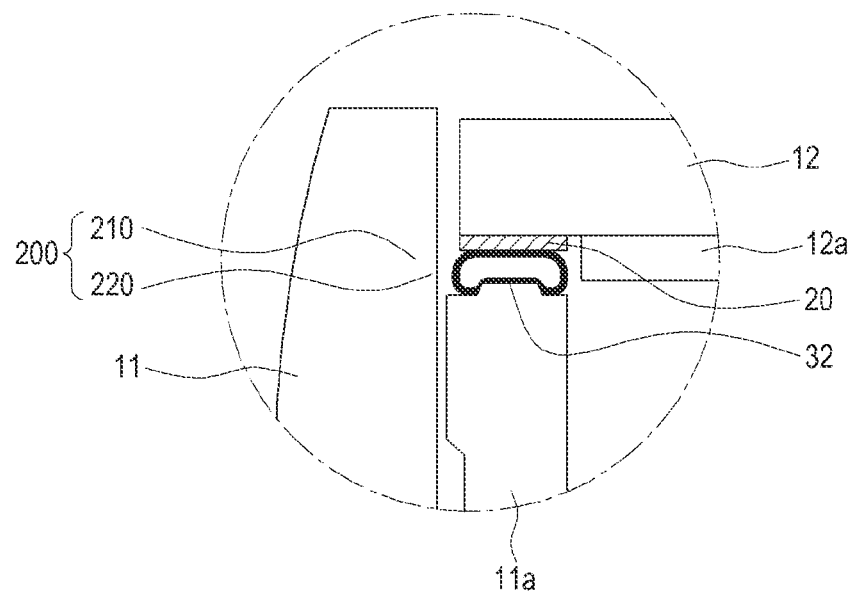
FIGS. 10A and 10B are views showing a form in which a coupling structure is provided in the sealing apparatus of FIG. 7 according to an embodiment of the present invention.
Figure 10B:
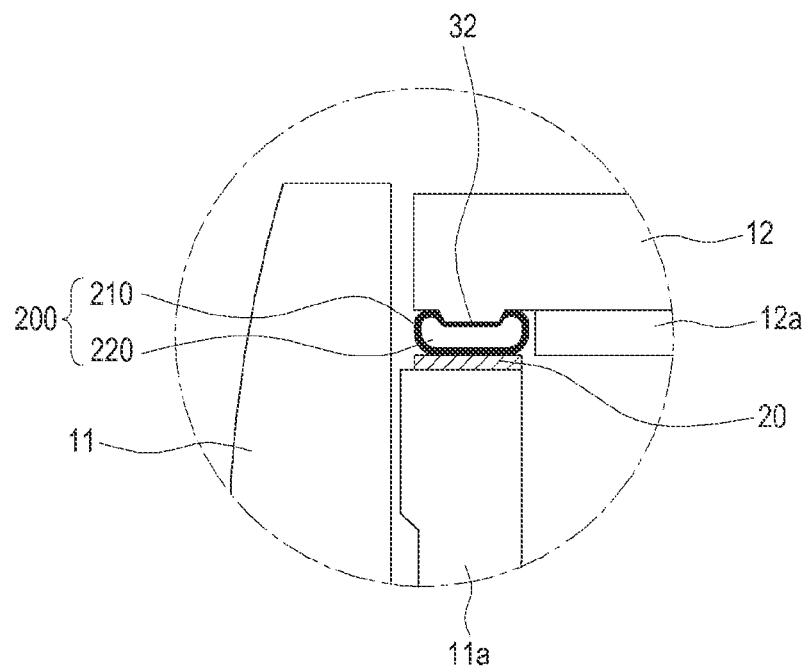

FIGS. 10A and 10B are views showing a form in which a coupling member 20 and a coupling structure are provided in the sealing apparatus of FIG. 7. Referring to FIGS. 10A and 10B, the coupling member 20 is only coupled to either the body 11 or the touch panel 12, while a boss 32 is formed on the other one of the body 11 or the touch panel 12 where the coupling member 20 is not provided so that the microtube 210 is attached to the boss 32 to be resiliently deformed.

That is, as shown in FIG. 10A, only one surface of the microtube 210 is fixed to the touch panel 12 by the coupling member 20. Since the body 11, to which the microtube 210 is coupled, has a protruding boss 32, the microtube 210 is attached to the coupling area S to be coupled to the boss 32 while being resiliently deformed to form a recess 31. Alternatively, as shown in FIG. 10B, the coupling member 20 is provided between the microtube 210 and the body 11 whereas a boss 32 protrudes from the touch panel 12, and a recess 31 is formed by the resilient deformation of the microtube 210 to be coupled to the boss 32 when the microtube 210 is attached and coupled to the coupling area S. Because the microtube 210 is resiliently deformed to be attached and coupled, a coupling force of the microtube 210 can be increased and a reliability of the seal can be improved.

Figure 11A:
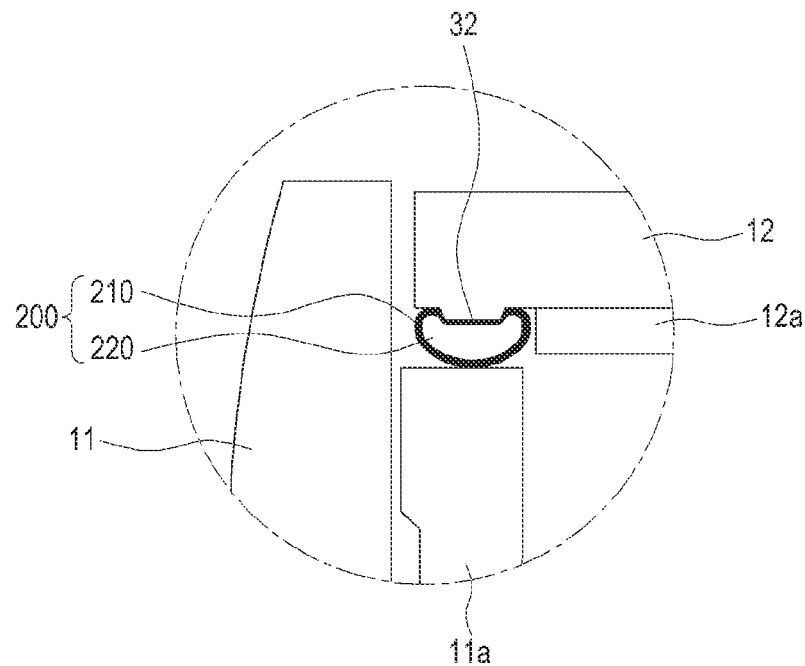
FIGS. 11A to 11C are views showing a form in which a coupling member and a coupling structure are provided in the sealing apparatus of FIG. 7 according to an embodiment of the present invention.
Figure 11B:
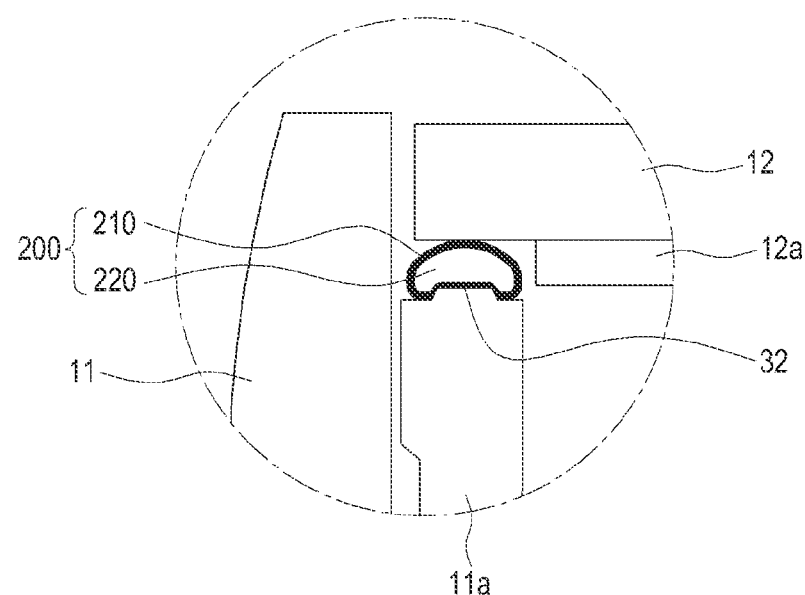
Figure 11C:
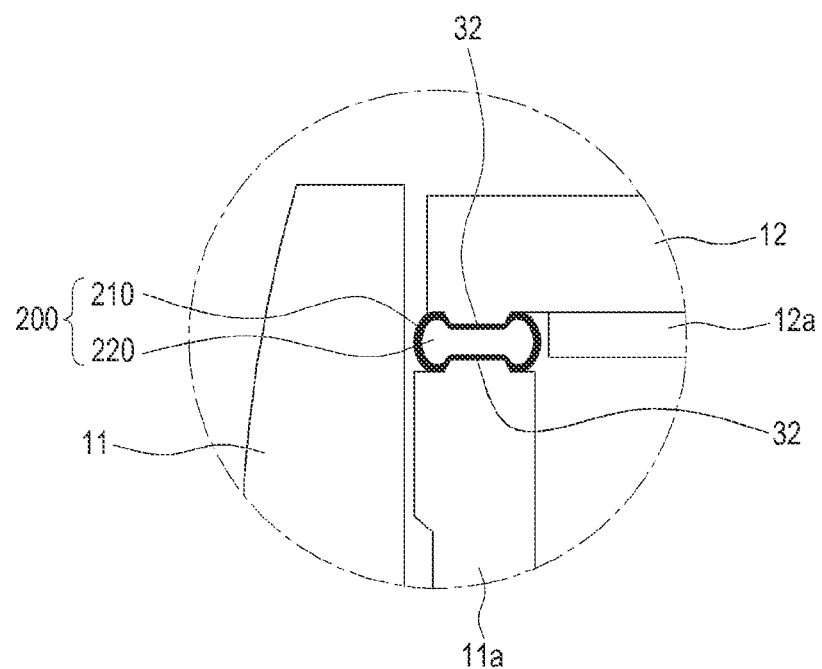

FIGS. 11A to 11C are views showing a form in which a coupling member 20 is not provided in the sealing apparatus of FIG. 7. Referring to FIGS. 11A to 11C, a boss 32 is formed in at least one of the body 11 and the touch panel 12 such that the microtube 210 is pressed by and coupled to the boss 32. In this way, the microtube 210, and the body 11 and the touch panel 12 can be attached and coupled to each other more firmly and entrance of foreign substances can be prevented more efficient.

Thus, the coupling area S can be sealed more firmly by the microtube 210, and vibrations provided to the touch panel 12 can be restrained from being transferred to the body 11 by means of the hollow part 220 provided in the microtube 210, and accordingly, the haptic feedback can be maximally transferred to the touch panel 12.

Figure 12:
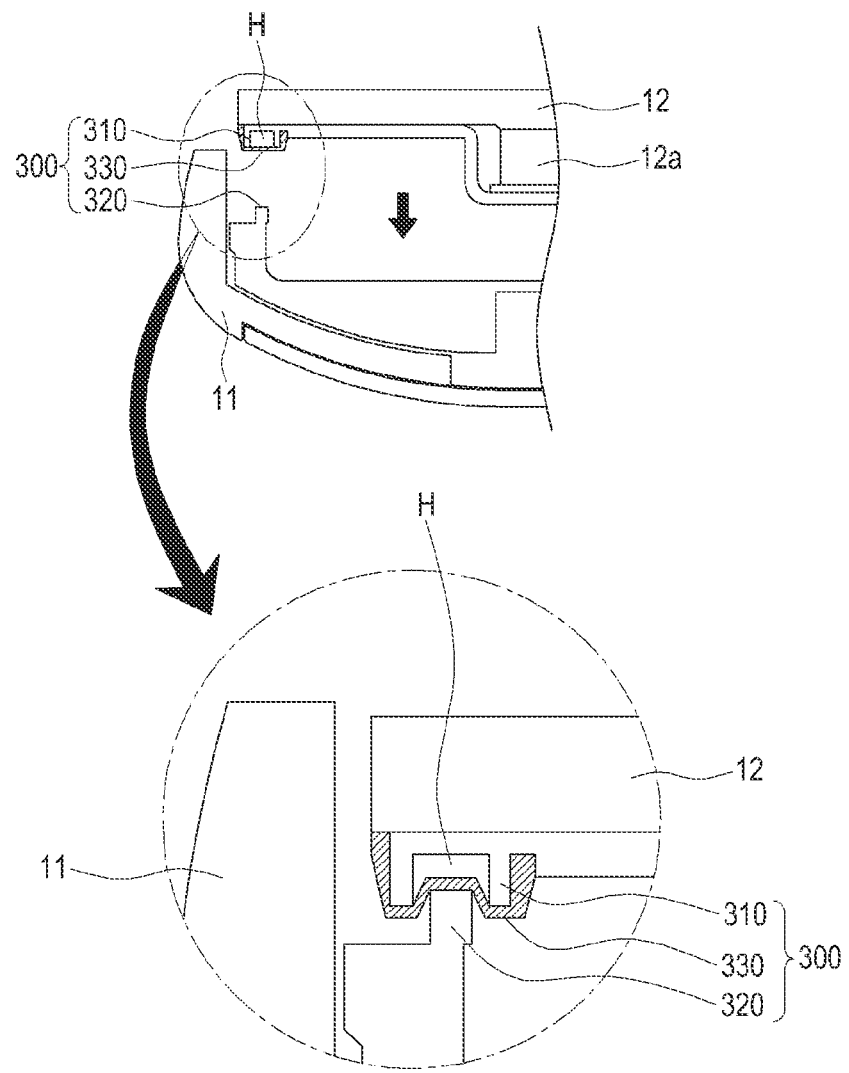
FIG. 12 is a view showing a sealing apparatus of a touch panel according to an embodiment of the present invention.

Hereinafter, the sealing apparatus 300 according to an embodiment of the present invention will be described in detail with reference to FIGS. 12 to 14. FIG. 12 is a view showing the sealing apparatus 300 of a touch panel 12 according to an embodiment of the present invention. Referring to FIG. 12, the sealing apparatus 300 includes a first boss structure 310, a second boss 320, and a resilient cover 330. The first boss structure 310 is provided along a periphery of the touch panel 12 coupled to the body 11, and includes a pair of bosses 311 protruding and facing each other. In particular, in the embodiment of the present invention, it is illustrated that the first boss structure 310 is formed and mounted to a lower side surface of the touch panel 12 and formed at a periphery of a bezel 12a providing a resilient force to the body 11.

Figure 13:
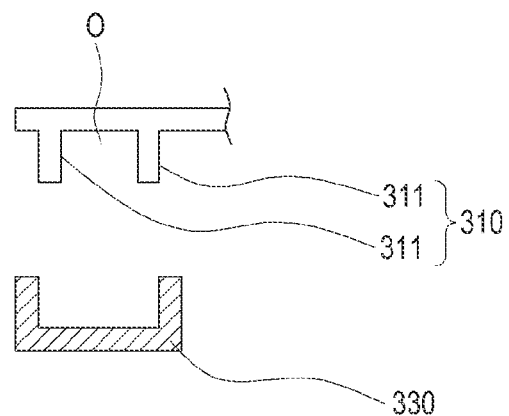
FIG. 13 is a view showing a first boss and a resilient cover of the sealing apparatus of FIG. 12 according to an embodiment of the present invention.
Figure 14:
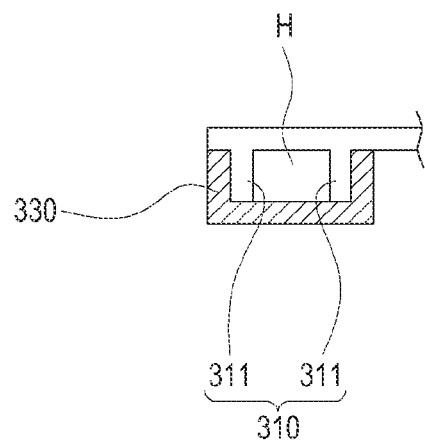
FIG. 14 is a view showing a couple state of the first boss and the resilient cover of FIG. 13 according to an embodiment of the present invention.

FIG. 13 is a view showing the first boss structure 310 and the resilient cover 330 of the sealing apparatus in FIG. 12. FIG. 14 is a view showing a coupled state of elements of FIG. 13. Referring to FIGS. 13 and 14, the first boss structure 310 protruding toward the body 11 along a periphery of the touch panel 12, specifically, the bezel 12a, has an inverse U shape in which the bosses 311 face each other. Accordingly, an opening O is formed between the bosses 311 such that the second boss 320 is coupled to the opening O. The resilient cover 330 is provided in the first boss structure 310. Accordingly, the resilient cover 330 is resiliently coupled to the bosses 311 such that the resilient cover 330 covers the opening O. That is, the resilient cover 330 is coupled to the inverse U-shaped first boss structure 310 in a U shape to cover the opening O so as to form the hollow part H shown in FIG. 14. The second boss 320 protrudes from the body 11 toward the opening O to press the resilient cover 330 toward the opening O. If the touch panel 12 is coupled to an upper side of the body 11, the second boss 320 is pressed toward the opening O covered by the resilient cover 330 by a predetermined depth and is attached and coupled to the coupling area S between the body 11 and the touch panel 12. Accordingly, if the touch panel 12 vibrates due to the driving of the haptic driving unit (not shown) provided on the lower surface of the touch panel 12, the vibrations of the touch panel 12 are prevented from being transferred to the body 11 by the hollow part H formed in the interior of the resilient cover 330, whereas the vibrations of the touch panel 12 can be maximized. Further, since the space between the body 11 and the touch panel 12 is attached, coupled, and sealed as the second boss 320 presses the resilient cover 330 toward the interior of the hollow portion H, entrance of foreign substances through the coupling area S is prevented.

Figure 15:
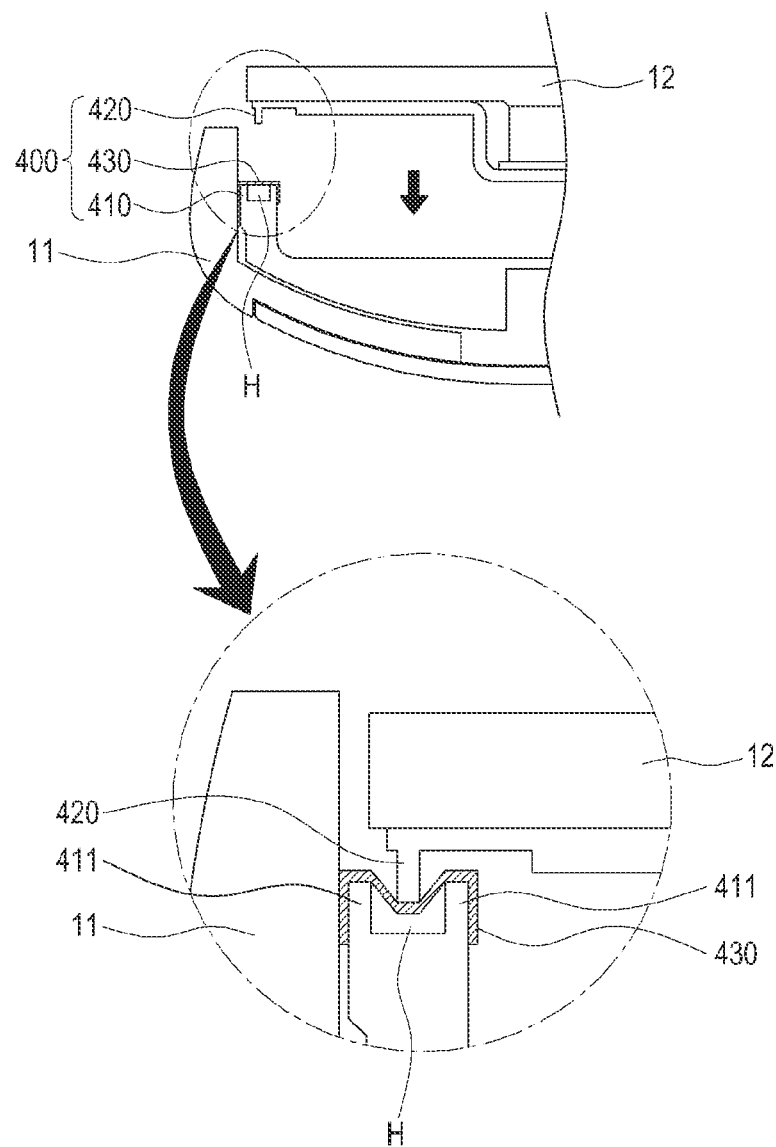
FIG. 15 is a view showing a sealing apparatus of a touch panel according to an embodiment of the present invention.

Hereinafter, the sealing apparatus 400 according an embodiment of the present invention will be described in detail with reference to FIGS. 15 to 17. FIG. 15 is a view showing the sealing apparatus 400 of a touch panel 12 according to an embodiment of the present invention. Referring to FIG. 15, the sealing apparatus 400 is similar to the sealing apparatus 300 according to the embodiment of the present invention illustrated in FIGS. 12-14, but they are different in that the sealing apparatus 400 is the inverse of the sealing apparatus 300.

Figure 16:
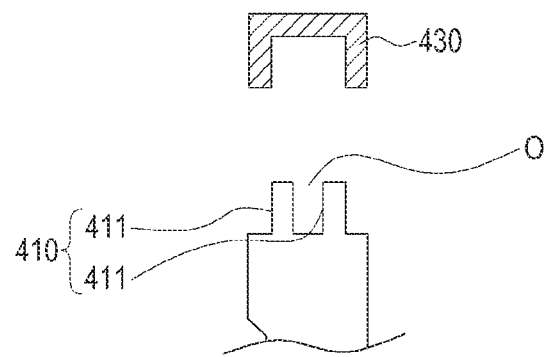
FIG. 16 is a view showing a first boss and a resilient cover of the sealing apparatus of FIG. 15 according to an embodiment of the present invention.
Figure 17:
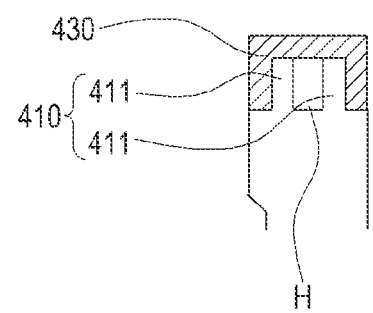
FIG. 17 is a view showing a couple state of the first boss and the resilient cover of FIG. 16 according to an embodiment of the present invention.

FIG. 16 is an exploded view showing a first boss structure 410 and a resilient cover 430 in the sealing apparatus of FIG. 15. FIG. 17 is a view showing a coupled state of the elements of FIG. 16. Referring to FIGS. 16 and 17, in detail, the sealing apparatus 400 of the present invention also includes a first boss structure 410, a second boss 420, and a resilient cover 430. The first boss structure 410 is provided along a periphery of the body 11 to which the touch panel 12 is coupled and includes a pair of bosses 411 protruding to face each other. The bosses 411 protruding toward the touch panel 12 face each other and have a U shape. A resilient cover 430 is provided on the first boss structure 410. Accordingly, the resilient cover 430 is resiliently coupled to the bosses 411 to cover an opening O between the bosses 411. That is, the resilient cover 430 is coupled to the first boss structure 410 in an inverse U shape to cover the opening O. The second boss 420 protrudes toward the opening O at a periphery of the touch panel 12, specifically, the bezel 12a, and presses the resilient cover 430 into the opening O. If the touch panel 12 is coupled to an upper side of the body 11, the second boss 420 is pressed into the hollow part H covered by the resilient cover 430 by a predetermined depth, and the coupling area S between the body 11 and the touch panel 12 is attached and coupled. Accordingly, the second boss 420 is pressed into the opening O, and the coupling area S between the body 11 and the touch panel 12 is sealed as the hollow part H formed by the second boss 420 is pressed toward the interior of the hollow part H by the resilient cover 430.

Accordingly, if the touch panel 12 vibrates due to the driving of the haptic driving unit (not shown) provided on the lower surface of the touch panel 12, the vibrations of the touch panel 12 are prevented from being transferred to the body 11 by the hollow part H.

Accordingly, in the structure in which the touch panel 12 is suspended over the body 11 to vibrate as a result of the haptic driving unit, a space between the body 11 and the touch panel 12 can be sealed off and vibrations of the haptic driving unit can be prevented from being transferred to the body 11 and isolated to the touch panel 12.

In the above-configured sealing apparatus of a touch panel, vibrations caused by the driving of the haptic driving unit can be prevented from being transferred to the body through the sealing apparatus while the touch panel is suspended above the body to provide a haptic feedback is attached and coupled to the body to be sealed, thereby making it possible to maximize vibrations of the touch panel.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A portable terminal comprising:
a body;
a touch panel;
a vibration actuator disposed under the touch panel; and
a resilient member that seals a coupling area between the body and the touch panel such that the touch panel is suspended over the body, the resilient member including a resilient attaching part and a hollow part,
wherein the resilient attaching part is attached between the body and the touch panel, and
wherein a vibration generated by the vibration actuator is provided to the touch panel while the touch panel is attached to the body by the resilient attaching part, and the hollow part restrains the vibration generated by the vibration actuator from being transferred to the body.

2. The portable terminal of claim 1, wherein the resilient attaching part comprises a poron material, and the hollow part comprises pores in the poron material.

3. The portable terminal of claim 1, wherein the resilient attaching part comprises a circular microtube, and the hollow part comprises one hollow portion in the microtube.

4. The portable terminal of claim 1, wherein the resilient member further comprises a coupling member for coupling the resilient member to the coupling area.

5. The portable terminal of claim 4, wherein at least one coupling member is provided between at least one of the touch panel and the resilient attaching part, or between the resilient attaching part and the body.

6. The portable terminal of claim 5, wherein the coupling member is provided between the touch panel and the resilient attaching part, a recess is formed on a surface of the resilient attaching part facing the body, and a boss is formed in the body to be pressed into and coupled to the recess.

7. The portable terminal of claim 5, wherein the coupling member is provided between the body and the resilient attaching part, a recess is formed on a surface of the resilient attaching part facing the touch panel, and a boss is formed in the touch panel to be pressed into and coupled to the recess.

8. A portable terminal comprising:
a body;
a touch panel;
a vibration actuator disposed under the touch panel; and
a resilient member that seals a coupling area between the body and the touch panel such that the touch panel is positioned on the body,
wherein the resilient member includes:
a pair of first bosses provided at a periphery of the touch panel and protruding to face each other so as to form an opening therebetween;
a second boss provided on the body at a location where the second boss protrudes into the opening; and
a resilient cover surrounding the first boss and covering the opening, and
wherein the resilient member is attached and coupled to a coupling area between the body and the touch panel to seal the coupling area while the touch panel is positioned on the body by the resilient cover.

9. The portable terminal of claim 8, wherein the resilient cover is provided to surround the first bosses so as to cover the opening and form a hollow part.

10. The portable terminal of claim 9, wherein the second boss is pressed to seal the coupling area while contacting the resilient cover covering the opening.

11. The portable terminal of claim 10, wherein the touch panel vibrates while attached to the body by the resilient cover, and vibrations of the touch panel are prevented from being transferred to the body by the hollow part.

12. A portable terminal comprising:
a body;
a touch panel;
a vibration actuator disposed under the touch panel; and
a resilient member that seals a coupling area between the body and the touch panel such that the touch panel is positioned on the body, wherein the resilient member includes:
a pair of first bosses provided at a periphery of the body and protruding to face each other so as to form an opening therebetween;
a second boss provided on the touch panel at a location where the second boss protrudes into the opening; and
a resilient cover surrounding the first bosses and covering the opening, and
wherein the resilient member is attached and coupled to a coupling area between the body and the touch panel to seal the coupling area while the touch panel is positioned on the body by the resilient member.

13. The portable terminal of claim 12, wherein the resilient cover is provided to surround the first bosses so as to cover the opening and form a hollow part.

14. The portable terminal of claim 13, wherein the second boss is pressed to seal the coupling area while contacting the resilient cover covering the opening.

15. The portable terminal of claim 14, wherein the touch panel vibrates while attached to the body by the resilient cover, and vibrations of the touch panel are prevented from being transferred to the body by the hollow part.

* * * * *